United States Patent
Melcher et al.

(10) Patent No.: US 8,935,128 B2
(45) Date of Patent: Jan. 13, 2015

(54) INTERFERENCE-COMPENSATED SENSOR

(75) Inventors: Rolf Melcher, Karlsruhe (DE); Erhard Musch, Werne (DE); Erhard Schweninger, Karlsruhe (DE); Roberto Zawacki, Kraichtal (DE)

(73) Assignees: Mechaless Systems GmbH, Karlsruhe (DE); ELMOS Semiconductor AG, Dortmund (DE)

( * ) Notice: Subject to any disclaimer, the term of this patent is extended or adjusted under 35 U.S.C. 154(b) by 879 days.

(21) Appl. No.: 13/129,776

(22) PCT Filed: Oct. 30, 2009

(86) PCT No.: PCT/EP2009/064389
§ 371 (c)(1),
(2), (4) Date: Aug. 5, 2011

(87) PCT Pub. No.: WO2010/057764
PCT Pub. Date: May 27, 2010

(65) Prior Publication Data
US 2011/0295505 A1    Dec. 1, 2011

(30) Foreign Application Priority Data

Nov. 20, 2008  (EP) ..................... 08169519

(51) Int. Cl.
| | | |
|---|---|---|
| G01R 17/06 | (2006.01) | |
| G05B 11/01 | (2006.01) | |
| G06F 17/40 | (2006.01) | |
| G06F 19/00 | (2011.01) | |
| B60S 1/08 | (2006.01) | |

(52) U.S. Cl.
CPC .............. B60S 1/0825 (2013.01); G05B 11/011 (2013.01); G01R 17/06 (2013.01); G06F 19/00 (2013.01); G06F 17/40 (2013.01)

USPC ........... 702/189; 73/1.01; 73/865.8; 327/526; 327/588; 702/104; 702/107; 702/187

(58) Field of Classification Search
CPC ................ B60S 1/00; B60S 1/02; B60S 1/04; B60S 1/06; B60S 1/08; G01D 7/00; G01D 9/00; G01D 21/00; G01R 17/00; G01R 17/02; G01R 17/06; G01R 35/00; G01W 1/00; G01W 1/14; G06F 11/00; G06F 11/30; G06F 11/32; G06F 11/34; G06F 17/00; G06F 17/40; G06F 19/00; G06F 15/00; G06F 15/16; G06F 17/10; G05B 11/00; G05B 11/01; G05B 11/011; G05B 11/06; G05B 15/00; G05B 15/02; G05B 99/00; G12B 13/00

USPC .......... 73/1.01, 170.16, 170.17, 432.1, 865.8, 73/866.3; 324/71.1, 76.11, 98, 99 R; 327/524, 526, 588; 702/1, 2, 3, 85, 702/104, 107, 127, 187, 189, 190
See application file for complete search history.

(56) References Cited

U.S. PATENT DOCUMENTS

| | | | | |
|---|---|---|---|---|
| 2,376,599 | A | * 5/1945 | Jones | 318/621 |
| 2,577,483 | A | * 12/1951 | Roosdorp | 324/71.1 |
| 3,133,607 | A | * 5/1964 | Gardner et al. | 177/108 |
| 4,300,116 | A | * 11/1981 | Stahovec | 340/904 |
| 5,726,547 | A | 3/1998 | Reime | |

FOREIGN PATENT DOCUMENTS

DE      102007009099 A1     8/2008

OTHER PUBLICATIONS

International Search Report dated May 27, 2010 for corresponding PCT Application No. PCT/EP2009/064389 (4 pgs.).

* cited by examiner

*Primary Examiner* — Edward Cosimano
(74) *Attorney, Agent, or Firm* — Shumaker & Sieffert, P.A.

(57) ABSTRACT

The interference-compensated sensor for detecting an object located in a detection area in a contactless manner, particularly a rain sensor, is provided with a first and a second measuring channel each having a control device and an output, wherein both measuring channels are substantially identical. The sensor further comprises a main subtractor having an output for outputting the difference of the signals at the outputs of the measuring channels. The sensor is provided with a controller unit having an input that is connected to the output of the main subtractor and with an output for outputting a controller signal, by means of which the two measuring channels can be controlled in such a way that the signal at the output of the main subtractor can be controlled to zero. By means of the magnitude of the signal at the output of the controller, it can be determined if an object is located in the detection area.

17 Claims, 14 Drawing Sheets

INTERFERENCE-COMPENSATED SENSOR

SUBJECT MATTER OF THE INVENTION

The invention relates to an interference-compensated sensor for contactless detection of an object located in a detection area, said object being e.g. a raindrop impinging particularly onto a windshield. Thus, the invention particularly relates to an interference-compensated rain sensor.

BACKGROUND OF THE INVENTION

Sensors which generate their (actual) output signal within the framework of a compensation method in a control process, are widely known.

For instance, EP-B 0 706 648 describes a method which is also known under the name "Halios" and can be applied to optical, capacitive and inductive sensor systems.
Halios Realization with RC Low-Pass Filters The mode of operation of a capacitive sensor based of these measurement methods is schematically illustrated in FIG. 1. At the nodes MODP and MODN, two push-pull signals which can be modulated in their amplitude, are fed into a measurement bridge consisting of two low-pass filters. The synchronous demodulator evaluates the amplified signal with regard to the residual signal so that the controller can minimize this residual signal by amplitude modulation. In case that both bridge arms are identical, the signal will be canceled at the node CM.

If such a cancellation holds true at any point of time, the signal is called a zero signal.

In dependence on the physical measurement principle and on the specific measurement method, the zero signal which is realized will be of a better or worse quality. In the above mentioned original, i.e. optical Halios method, for instance, a very good (true) zero signal is achieved. The measurement pulses in all of their varieties (transmitting current, emitted and received light, photocurrent in the photodiode, voltage at the amplifier) largely maintain their shape, notably a rectangular shape.

In principle, the half bridge in FIG. 1 allows for the implementation of the Halios method on a capacitive basis. However, the signal existent at the amplifier output will normally not be a true zero signal anymore. Complete cancellation is obtained only in the compensated state of the measurement bridge. Should the bridge be misadjusted, i.e. should $C_{MESS}$ and $C_{REF}$ be different from each other, the controller will merely be able, by changing the amplitudes, to perform a counterbalancing control of the measurement loop for the detection times.

At the output of the amplifier, there is generated the curve development shown in FIG. 2. The quite distinct "residual signal" clearly delimits the (linear) amplification of this signal and thus also the sensitivity of the sensor.
Halios Realization with Longitudinal Capacities and Charge Amplifier A better accuracy of the signal shape can be obtained in that the measurement and reference capacities are not arranged according to ground but, instead, are inserted "longitudinally". If the amplifier is provided with a substantially capacitive feedback, the charge amplifier shown in FIG. 3 is obtained.

Excitation of the half bridge by square wave signals will result in square wave signals also at output of the amplifier. The controller can control the difference signal to the effect that it will be a true zero signal. The amplification of the amplifier stage can be selected to be high so that the sensor can become very sensitive. Of advantage for the practical realization is also the fact that the parasitic capacity of the CM node against ground does not play any role anymore.
Improvement of EMV The measurement principle of capacitive sensor technology is based on the influence that the measurement object has on the measurement capacities and respectively on the electric fields in these capacities. After all, this sensor technology is in principle receptive to electromagnetic radiation from outside.

Along with the increase of the sensitivity of the actual sensor surfaces (e.g. by enlarging these surfaces), also the sensitivity to interference from outside will generally increase by the same extent. For the practical use, it is essential that this disadvantage is eliminated or significantly mitigated.

SUMMARY OF THE INVENTION

The invention proposes an interference-compensated sensor for contactless detection of an object located in a detection area, said sensor being particularly a rain sensor, said sensor comprising a first and a second measuring channel each having a control device and an output, both said measuring channels particularly being substantially identical, a main subtractor having an output for outputting the difference of the signals at the outputs of the measuring channels, and a controller unit having an input connected to the output of the main subtractor and having an output for outputting a controller signal, by means of which the two measuring channels can be controlled in such a manner that the signal at the output of the main subtractor can be controlled to zero, on the basis of the magnitude of the signal at the output of the controller, it being determinable whether an object is located in the detection area.

As compared to the state of the art, the sensor of the invention has the advantage of high immunity against electromagnetic interference (EM interference). This sensor will be explained hereunder by way of a capacitive sensor concept of the type suited particularly for a capacitive rain sensor, e.g. for use in a vehicle. Generally, the sensor can operate in a capacitive, inductive, optical or resistive manner. The basic thought of the invention resides in providing two geometrically and/or electrically substantially identical sensor elements (namely a measuring and a reference sensor element) and measurement channels, respectively, which are exposed to far-field interference substantially to the same extent, so that the interference signals caused by far-field interference can be eliminated in a main subtractor connected farther downstream. If the two sensor elements and/or measurement channels have a known disparity (also called asymmetry), this can be compensated for by a weighting (optionally adjustable) in the main subtractor, which is performed particularly with the objective of a considerable suppression of electromagnetic noise.

Whenever, in the context of the invention, it is mentioned that the signal at the output of the main subtractor can be controlled to zero, this means that said signal can be controlled to zero at least at a (random) point of time in the control process. Thus, there are covered those cases where the signal is controlled to zero throughout the clock period or the signal is controlled to zero during a partial period of the clock period or is controlled to zero at least at one point of time. The obtaining of a "difference" relates both to the difference between voltage levels and the difference between current levels. Thus, what is denoted here is the computation of a difference of general signal levels.

According to preferred embodiment of the invention, it is provided that each measurement channel comprises a measurement branch with a measurement branch control unit for generating a measurement signal at an output of the measurement branch, and a reference branch with a reference branch control unit for generating a reference signal at an output of the reference branch, a first and a second measurement channel subtractor are provided, each measurement channel having assigned to it a respective subtractor for obtaining the difference signal between the measurement and reference signals at the outputs of the measurement and reference branches of the respective measurement channel, and the difference signal being provided at the measurement channel output of the respective measurement channel, the main subtractor is arranged between the first and second measurement channel subtractors on the one hand and the control unit on the other hand, and the measurement and reference branches of the two measurement channels are controllable on the basis of the controller output signal in such a manner that the difference signal of the measurement and reference signals of each measurement channel can be controlled to zero.

According to a further preferred embodiment of the invention, both measurement channels can be controllable simultaneously or alternately over time, or, however, each measurement channel can be controllable intermittently and its measurement and reference branches can be controllable in push-pull operation. The controlling of both measurement channels and, respectively, of the measurement and reference branches of both measurement channels to zero can be performed by amplitude modulation.

In the most simple embodiment, each of the first and second subtractors can be formed as a connecting node of the outputs of the measurement and reference branches of the respective measurement channel. In this case, it is further of advantage if each of the first and second subtractors and/or of the further subtractors comprises a signal amplifier.

According to a further advantageous embodiment of the invention, it can be provided that, with the aid of the controller signal, the control units of the measurement and reference branches of both measurement channels can be controlled. Alternatively, the reference channels can comprise adjustable reference elements which can be varied with the aid of the controller signal.

BRIEF DESCRIPTION OF THE DRAWINGS

The invention will be explained in greater detail hereunder by way of several embodiments and with reference to the drawing. In the various Figures of the drawing, the following is shown.

DETAILED DESCRIPTION

Figure 1:
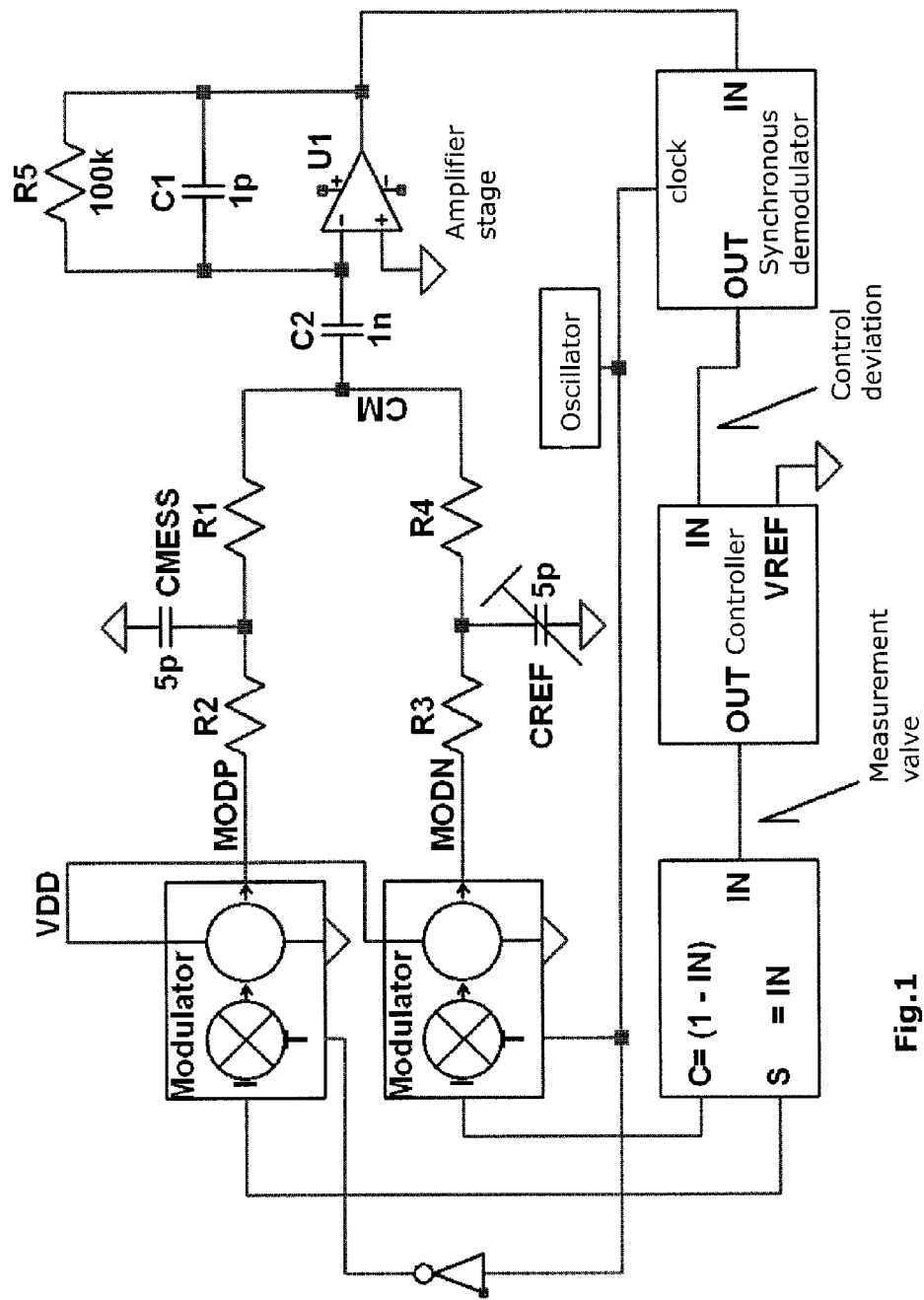
FIG. 1 a circuit of a known capacitive Helios measurement bridge with RC low-pass filters, FIG. 2 the signal development at the output of the transimpedance amplifier in the circuit according to FIG. 1 in the finally controlled state and in the non-finally-controlled state, wherein the control makes use of detection values at times which in the diagram are marked by vertical black lines, FIG. 3 a circuit of a known capacitive Halios measurement bridge with longitudinal capacities, FIG. 4 a first embodiment of a sensor of the invention, illustrated as a block diagram of a capacitive measurement bridge, FIG. 5 the signal developments during a measurement process without interference, in the circuit according to FIG. 4, FIG. 6 a block diagram of a capacitive measurement bridge in case of EM interference coupling, FIG. 7 the signal developments during the presence of interference in the circuit according to FIG. 6, FIG. 8 a block diagram of the control circuit for measurement of electric parameters in the sensor network, FIG. 9 a circuit diagram of a sensor/reference network for measurement of mass-related capacities, FIG. 10 a sensor network for measurement of the capacitive voltage divider via a high-impedance differential amplifier input with active summation, FIG. 11 a sensor network for measurement of the capacitive voltage divider with passive summation at the nodes CM and CMK, FIG. 12 a block diagram of a differential-value sensor without reference network, FIG. 13 a block diagram of a sensor network with control of RLC parameter values in the adaptive sensor control circuit, and FIG. 14 a block diagram similar to FIG. 13, wherein a null adjustment is performed during the suppression of electromagnetic interference by asymmetric change of the amplification factor in the differential amplifier.
Figure 2:
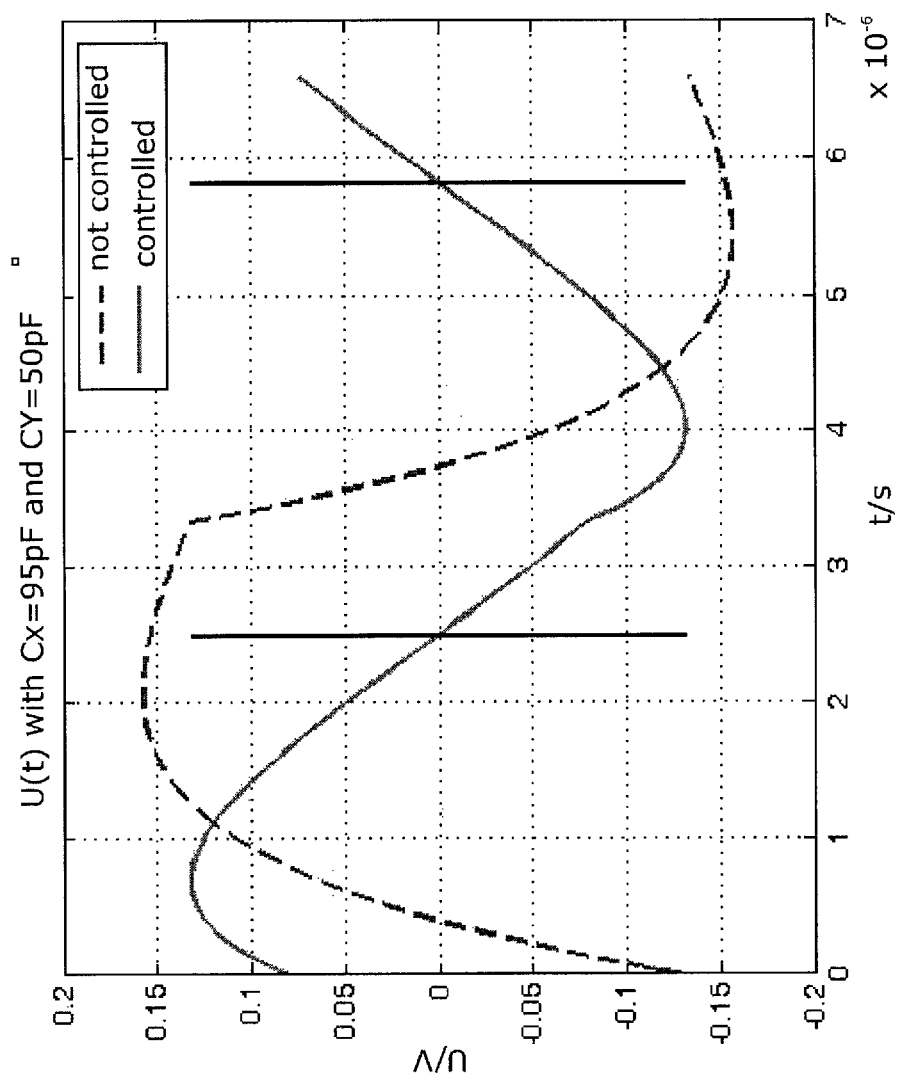
Figure 3:
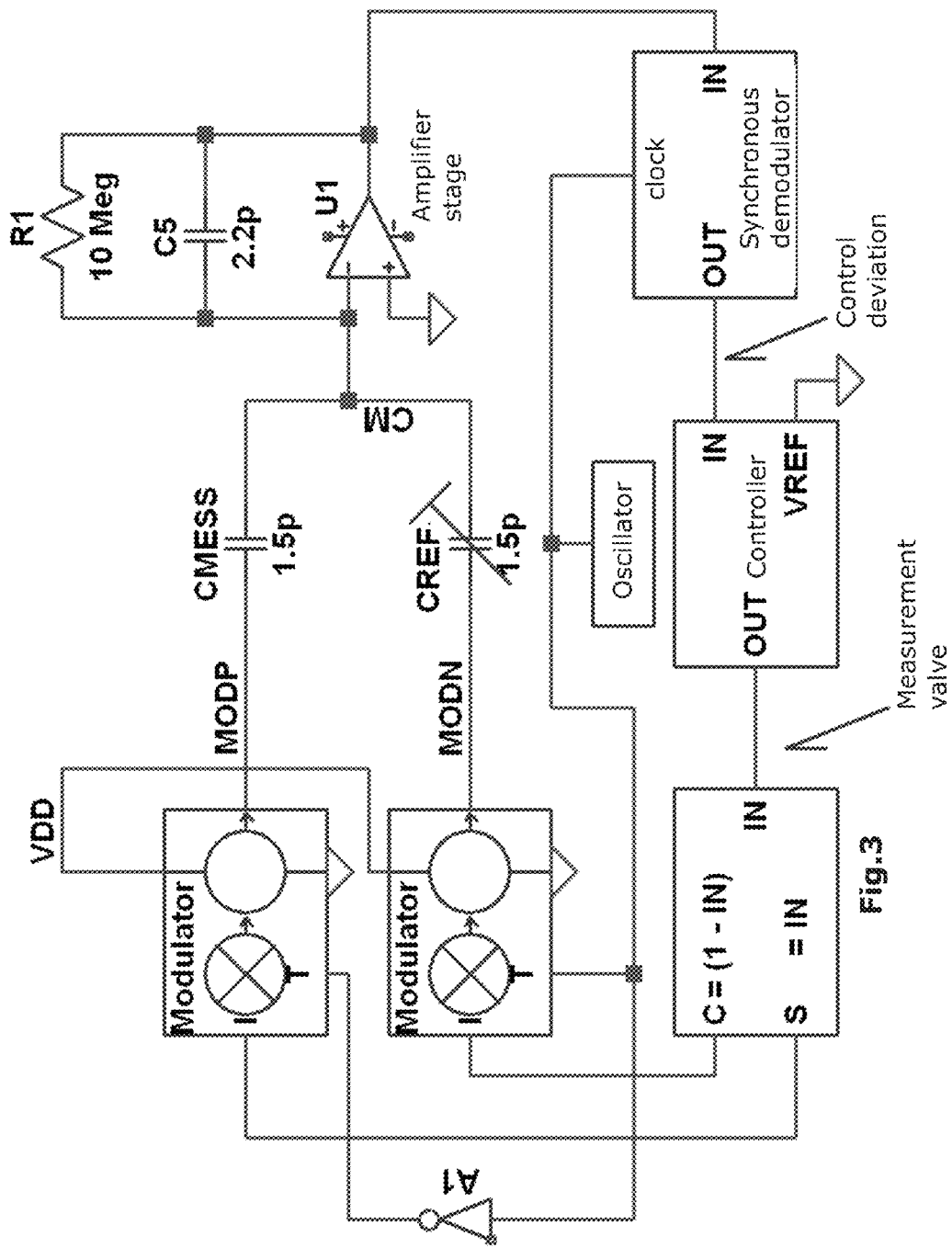

In the following detailed description of the Figures, several embodiments of the invention will be explained, wherein identical component parts or elements of the sensors (i.e. parts or elements which are identical in function or design) are provided with identical reference numerals in the Figures.

In FIGS. 4 to 7, a first embodiment of an interference-compensated sensor 10 is shown. Said sensor 10 comprises a first measurement channel 12 as well as a second measurement channel 14 which are substantially of identical design. Each measurement channel 12,14 comprises an input 16 and respectively 18 in each of its two measurement branches (see further below), as well as an output 20 and 22, respectively. Each measurement channel 12,14 further comprises control units 42,44 and 46,48 with respectively two inputs for generating two amplitude-modulated clock signals (see further below). The amplitude value is obtained, with the aid of the functional unit 62, from the measurement value. The two outputs 20,22 of the two measurement channels 12,14 are connected to the inputs of a main subtractor 24. The output 26 of this main subtractor 24 is connected to the input 28 of a control unit 30 which, at its output 32, carries the actual measurement value in the form of a signal that is used for control of the measurement channels 12,14 for null adjustment, as is generally known from the method referred to under the name Halios.

Figure 4:
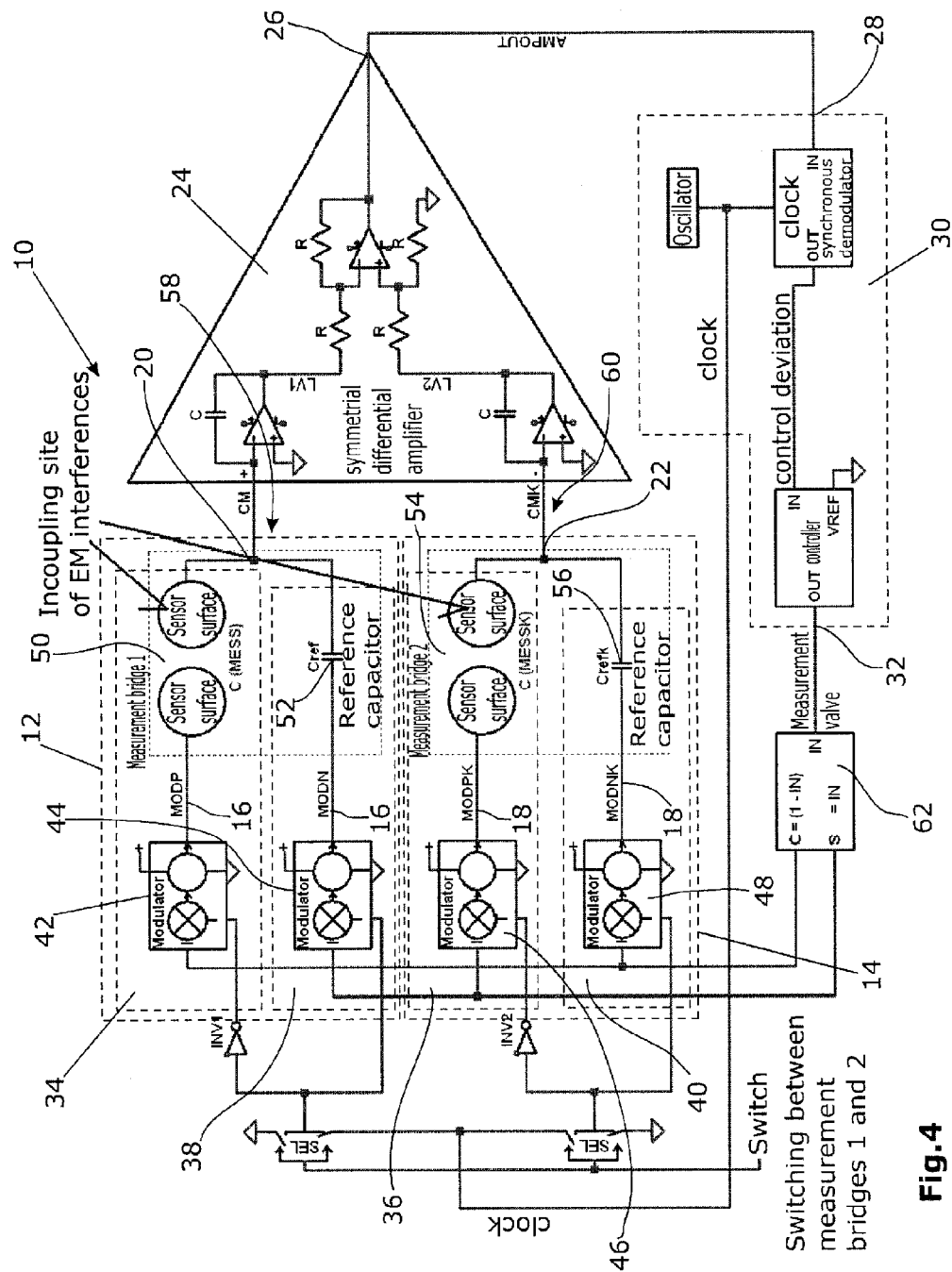

In the embodiment according to FIG. 4, each measurement channel 12,14 of sensor 10 comprises a measurement branch 34 an respectively 36 (hereunder referred to as first measurement branch 34 and second measurement branch 36) as well as a reference branch 38 and respectively 40 (hereunder referred to as first reference branch 38 and second reference branch 40). Each of said measurement and reference branches comprises a control unit 42, 44, 46 and 48, respectively. Said first measurement branch 34 is connected to a measurement capacitance 50 (CMESS) while the first reference branch 38 is provided with a reference capacitance 52 (Cref). Said measurement and reference branches of the second measurement channel are provided with a further measurement capacitance 54 (CMESSK) and respectively a further reference capacitance 56 (Crefk). The two measurement and reference branches of each of the two measurement channels 12,14 are joined at the outputs 20,22, and these outputs 20,22 form first and second measurement-channel subtractors 58,60.

The functional principle the inventive design of the measurement method illustrated in FIG. 4 resides in that, by means of a second sensor capacity (CMESSK) which geometrically is very similar to the first sensor capacity (CMESS), the interferences will be captured once more, and that the interference signals from the two sensor branches are caused to eliminate each other in the downstream-connected differential amplifier.

Figure 5:
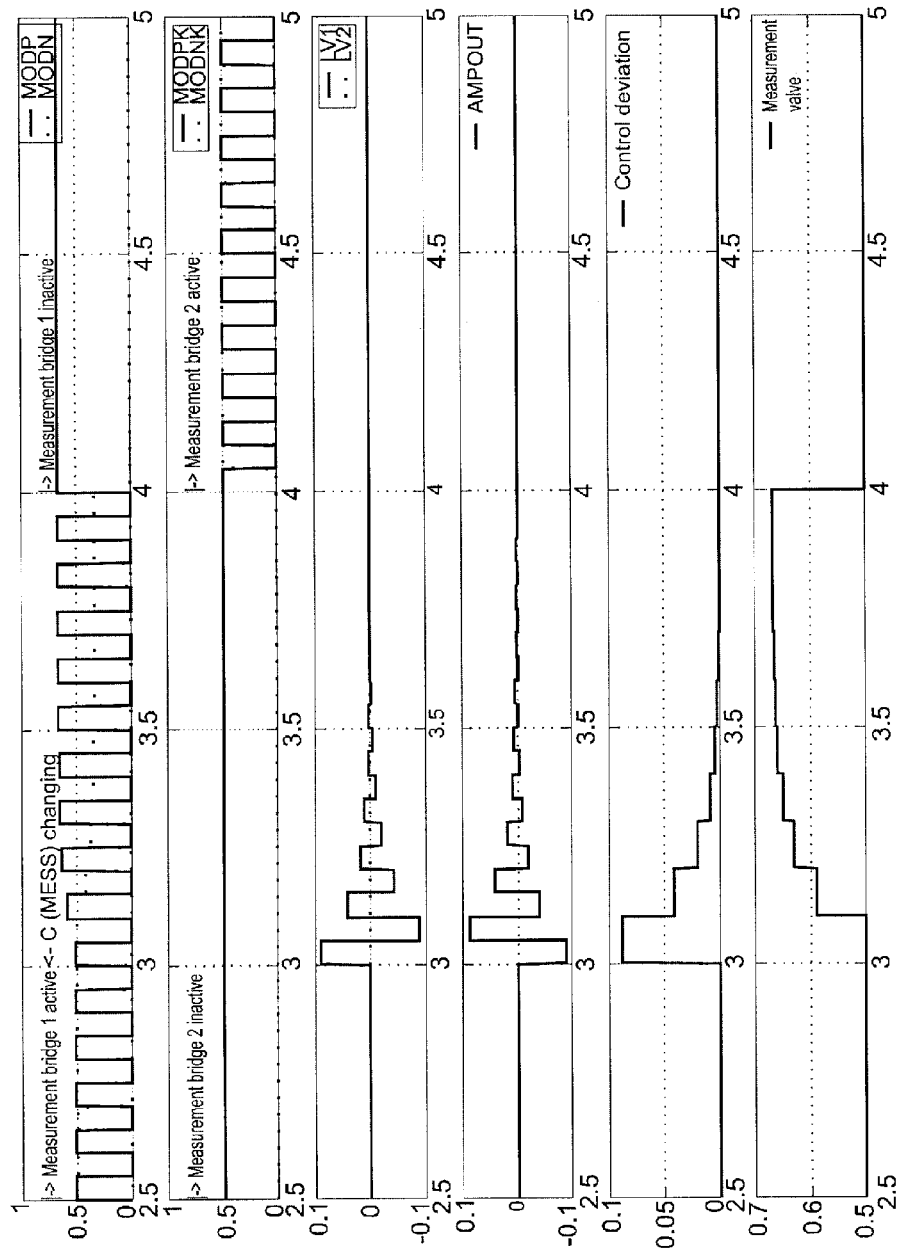

The principle development of the measurement without interference is shown in FIG. 5. First, using the signals MODP and MODN, the controlling of the measurement bridge 1 is performed. The measurement bridge 2 is inactive during this time. At the point of time $t/t_N=3$, the measurement capacity CMESS and the reference capacity have the same value. Thus, in the finally controlled state, the modulation amplitudes at the nodes MODP and MODN also have the same value, and at the output of the first charge amplifier (node LV1), the currents will eliminate each other via the two branches of the measurement bridge 1. The control circuit is in the finally controlled state. At the time $t/t_N=3$, the measurement capacity will change. Thereby, a signal is generated at the charge amplifier LV1 that will be rectified by the synchronous demodulator. The controller will change the modulation amplitudes until the control deviation has become zero again. At the time $t/t_N=4$, measurement bridge 2 is activated while measurement bridge 1 is switched off. In the normal case, this switch-over leads to a transient phenomenon which is not shown here. It is assumed that the controller will start with the last working point which it had prior to deactivation of the measurement bridge 2. Since the capacity CMESSK does not vary during the measurement, the measurement bridge remains in the controlled state.

Figure 6:
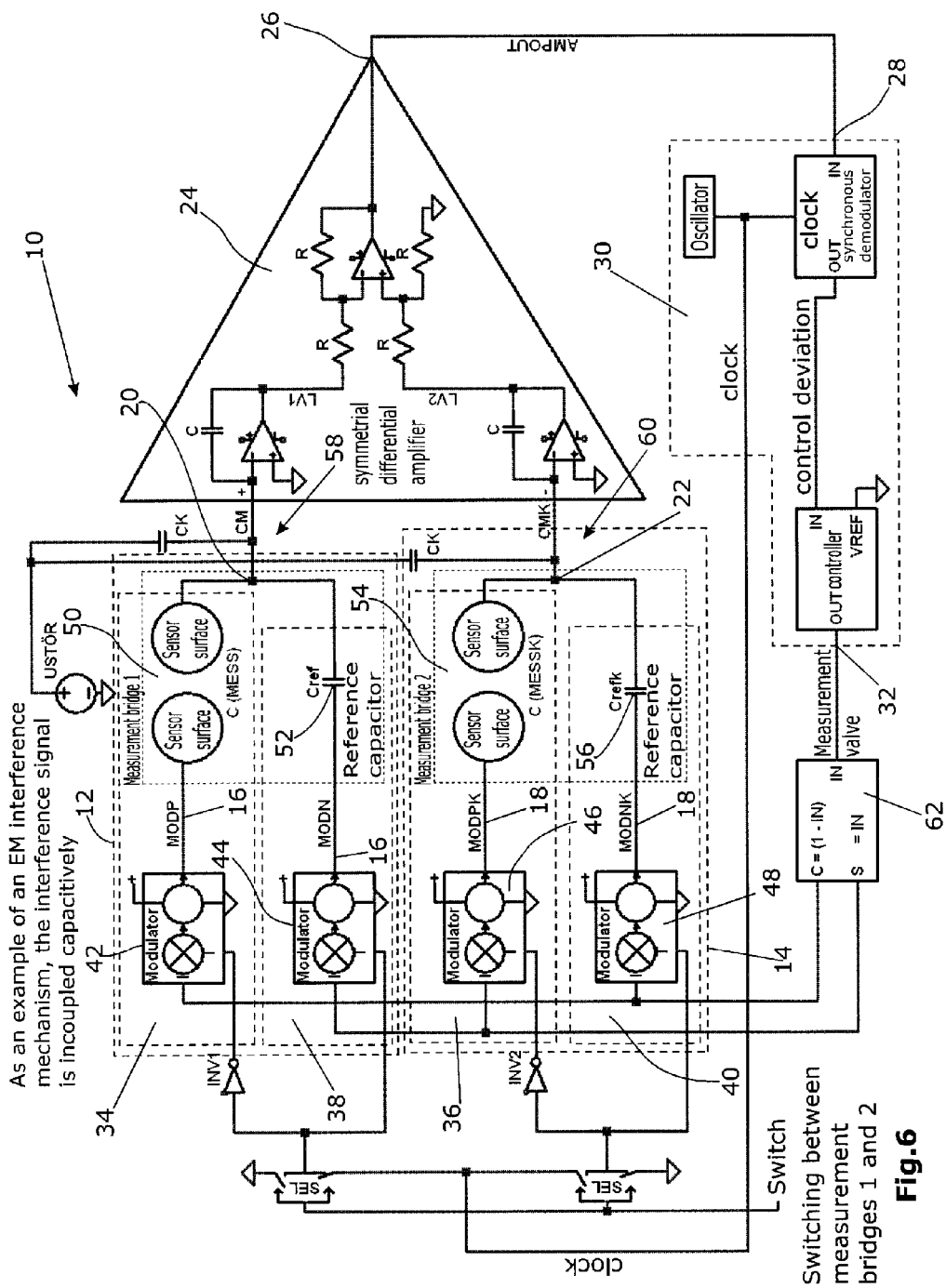
Figure 7:
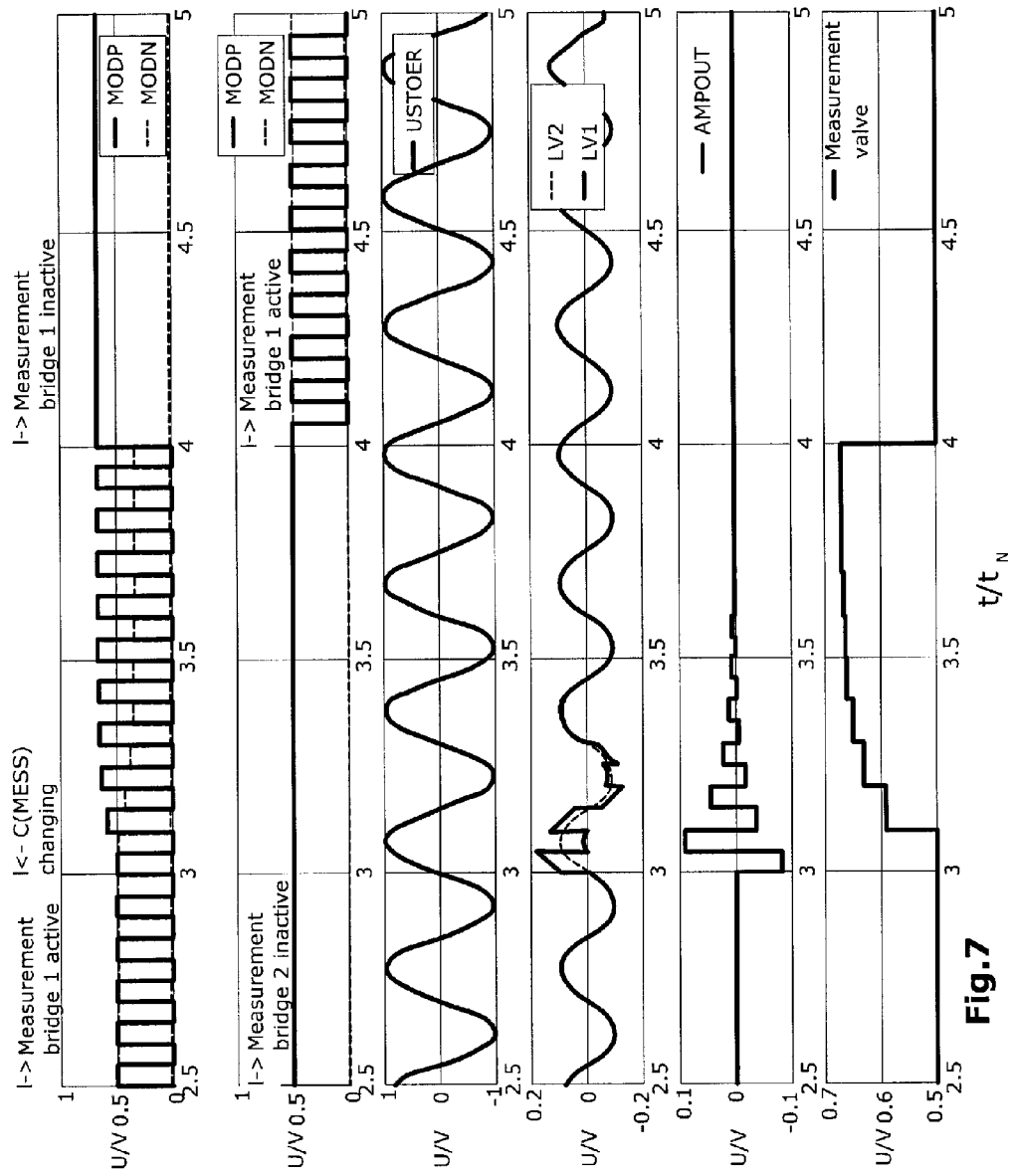

The interferences will normally be coupled, in the form of electromagnetic radiation, into the amplifier, which will take place at the nodes CM and CMK. By way of example, FIG. 6 shows the case of a capacitive incoupling. The signal development of the sinusoidal interference (USTÖR) is shown in FIG. 7. This interference signal is now superimposed on the signals at the outputs LV1 and LV2 of the two charge amplifiers. Due to the common mode rejection of the downstream-connected differential amplifier, the interference will be damped. The useful signal, however, will be forwarded in an amplified state to the demodulator so that the measurement can be performed without being affected by the disturbances.

The inventive design of the sensor (not only according to FIGS. 4 to 7 but in general) has the property of being able to effectively suppress electromagnetic interference even in the range of the synchronous frequency and its multiples. Optimum operation is obtained if the antenna effects of both sensor networks against EM interference are identical. It is of advantage if the sensor surfaces are geometrically close to each other, are arranged symmetrically to each other and—if possible—have no large geometric extension. Thereby, it is achieved that the intensity of the interference is equal at both summation points, so that the elimination in the following differential amplifier will be performed with the quality of the common mode rejection of the latter.

Since the sensor electrode provided for interference suppression, CMEESK, can be used directly for retrieval of the signal (by corresponding phase shifting), optimum use is made of the whole sensor surface.

Description of the Preferred Embodiments

Figure 8:
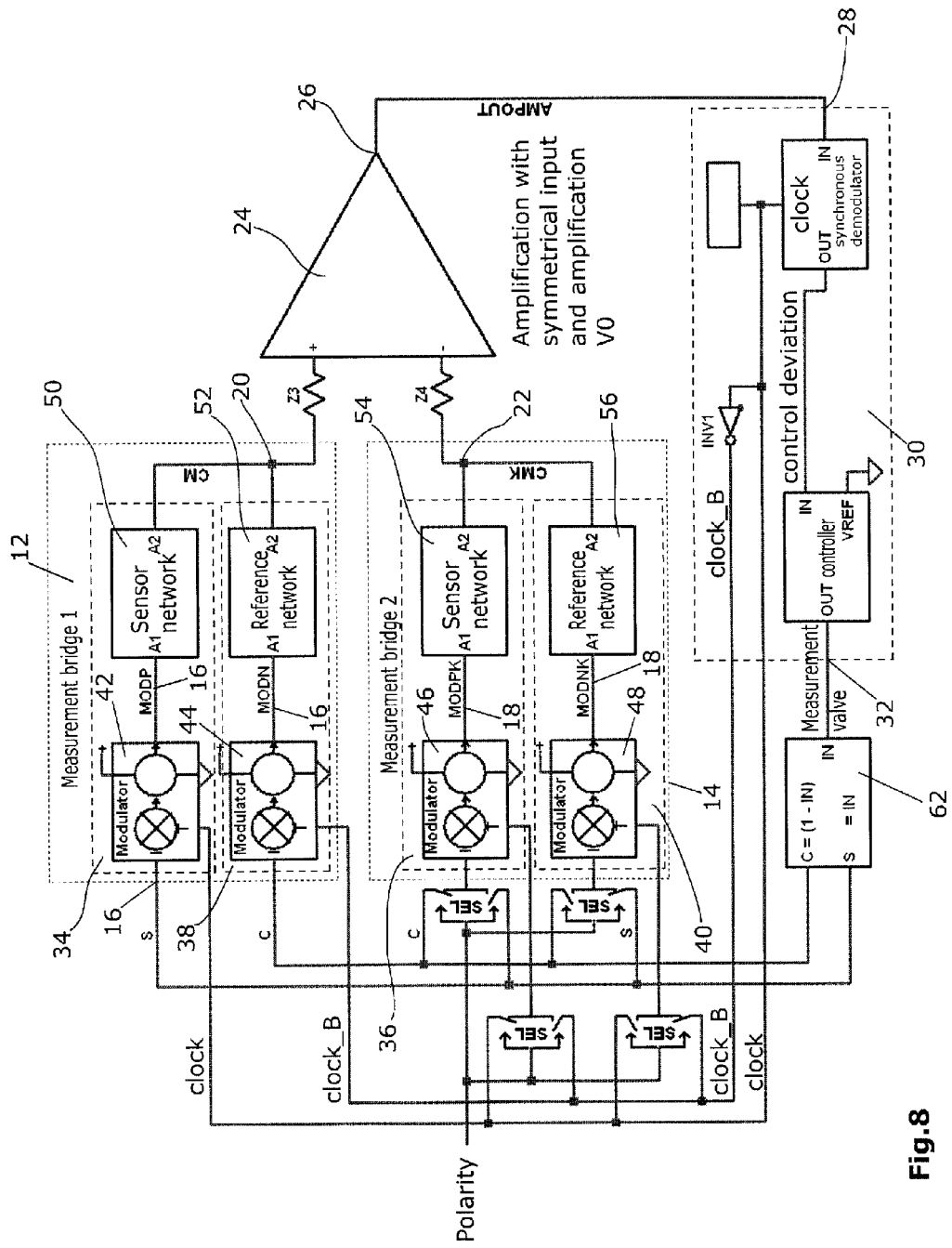

The block diagram shown in FIG. 8 represents the layout of the sensor for measurement of electric parameters in a random linear RLC network. What is measured are the changes of the parameters of RLC network elements 50,54 in comparison with the reference RLC network 52,56.

Now as before, a good EMW demands that the disturbing incident radiation enters the two sensor networks of the sensor (measuring) bridges 12 and 14 to the same extent (symmetrically).

The control of the two measurement bridges 12 and 14 can be performed simultaneously or sequentially in time. FIG. 8 illustrates the case for simultaneous measurement. In this case, the clock signals of all four modulators are active during measurement. In the general case, when the RLC parameters of the two sensor networks do not fully coincide in their branches 34,38 and 36,40, respectively, a cancellation of the useful signal to zero will occur only at the node AMPOUT 26 and indeed not at the summation points CM 20 and CMK 22.

With the aid of the signal "polarity" shown in FIG. 8, switching between difference operation and summation operation is possible. In the summation mode, the changes of electric parameters in the two sensor networks will be added to each other in the control signal "measurement value". In difference operation, only the differences between the two "sensor halves" 12,14 will be registered. This operating mode is suited particularly if the useful signal is generated as a difference signal and the common mode portion (e.g. temperature influence) shall be suppressed.

In the temporally sequential measurement, it is provided, as shown in FIGS. 4 and 5, that only one channel is modulated while the modulation sources of the other channels are inactive. In this type of control, the zero cancellation will occur already at the summation point CM and respectively CMK of the respective active channel.

Examples of Sensor/Reference Networks

Figure 9:
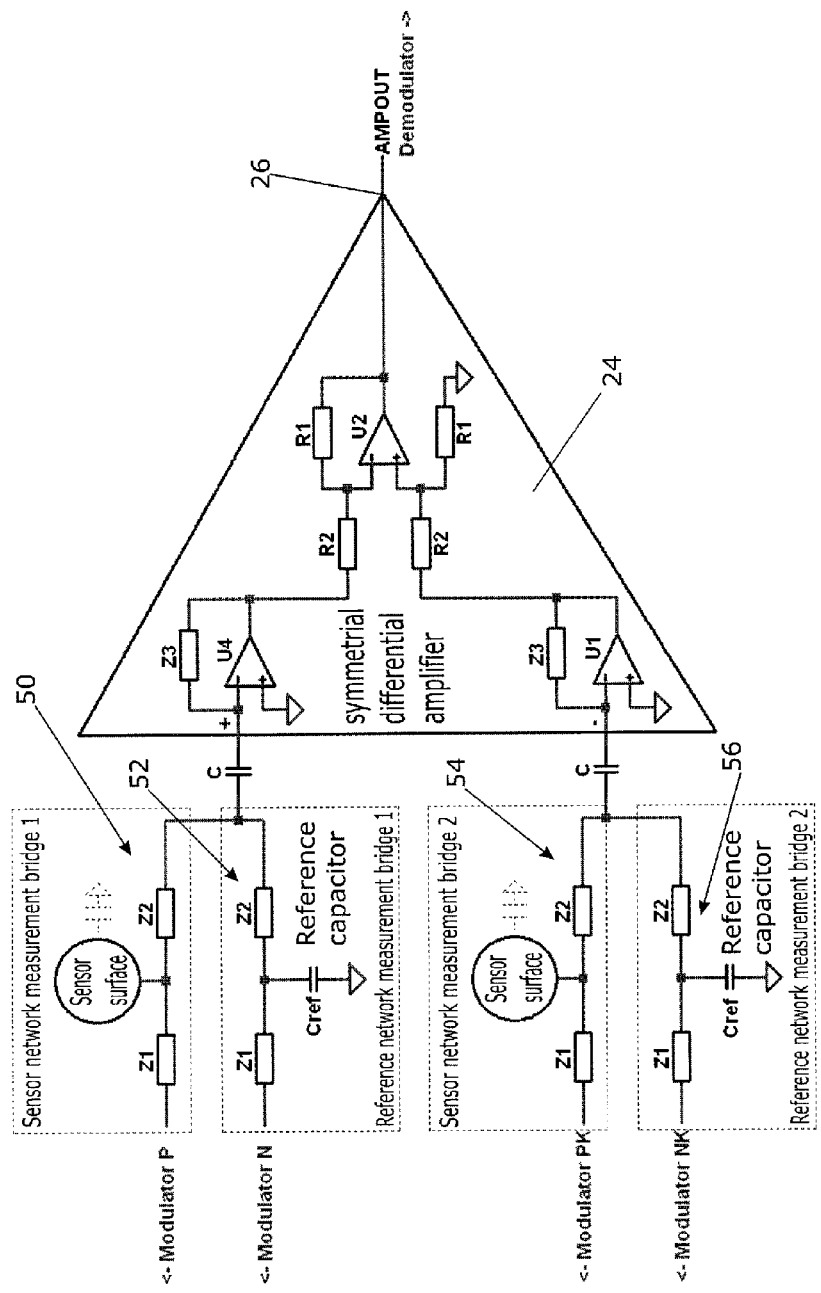
Figure 10:
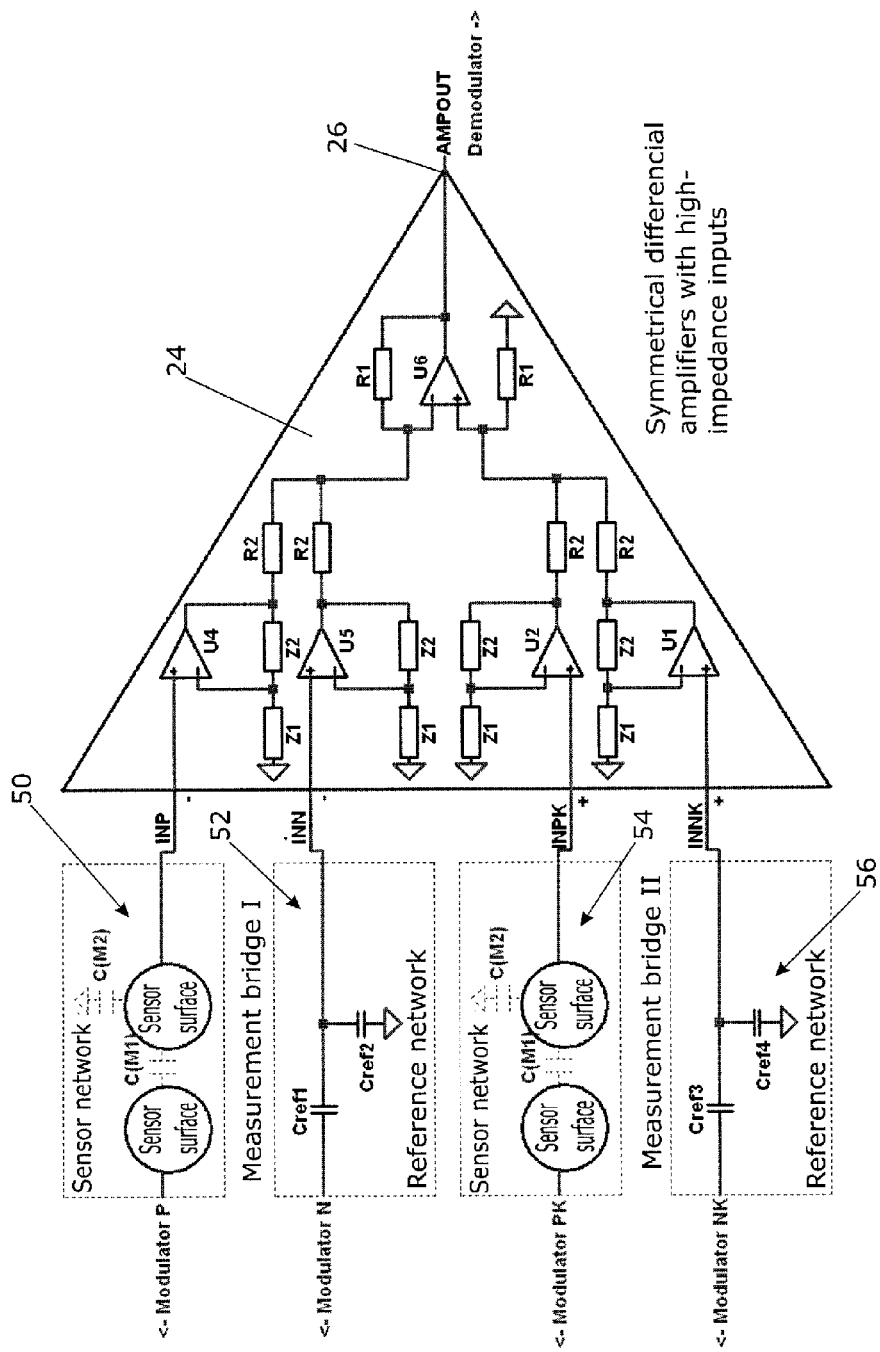
Figure 11:
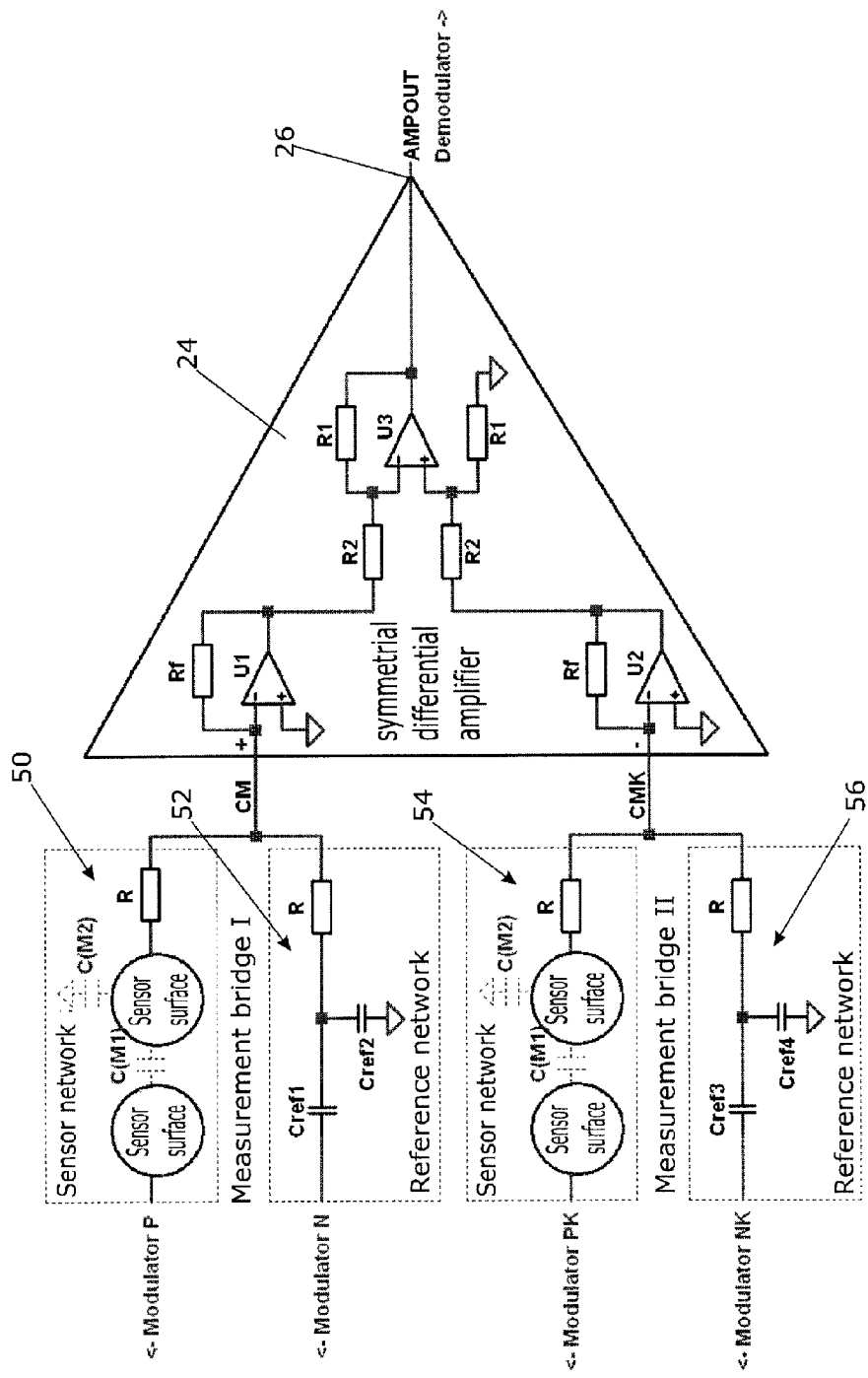

Examples of sensor/reference networks are shown in FIGS. 9 to 11. The circuit shown in FIG. 9 is suited for measuring mass-related capacities. The network shown in FIG. 10 is used for measuring the capacitive voltage divider comprising the capacities C(M1) and C(M2). Evaluation is performed by means of an electrometer amplifier with active summation. FIG. 11 shows a further variant of evaluating the capacitive voltage divider. In this case, the outcoupling of the voltage is performed via high-impedance resistors. Thus, the summation can be performed passively at the nodes CM and CMK.

Sensor Variant without Sensor Network

Figure 12:
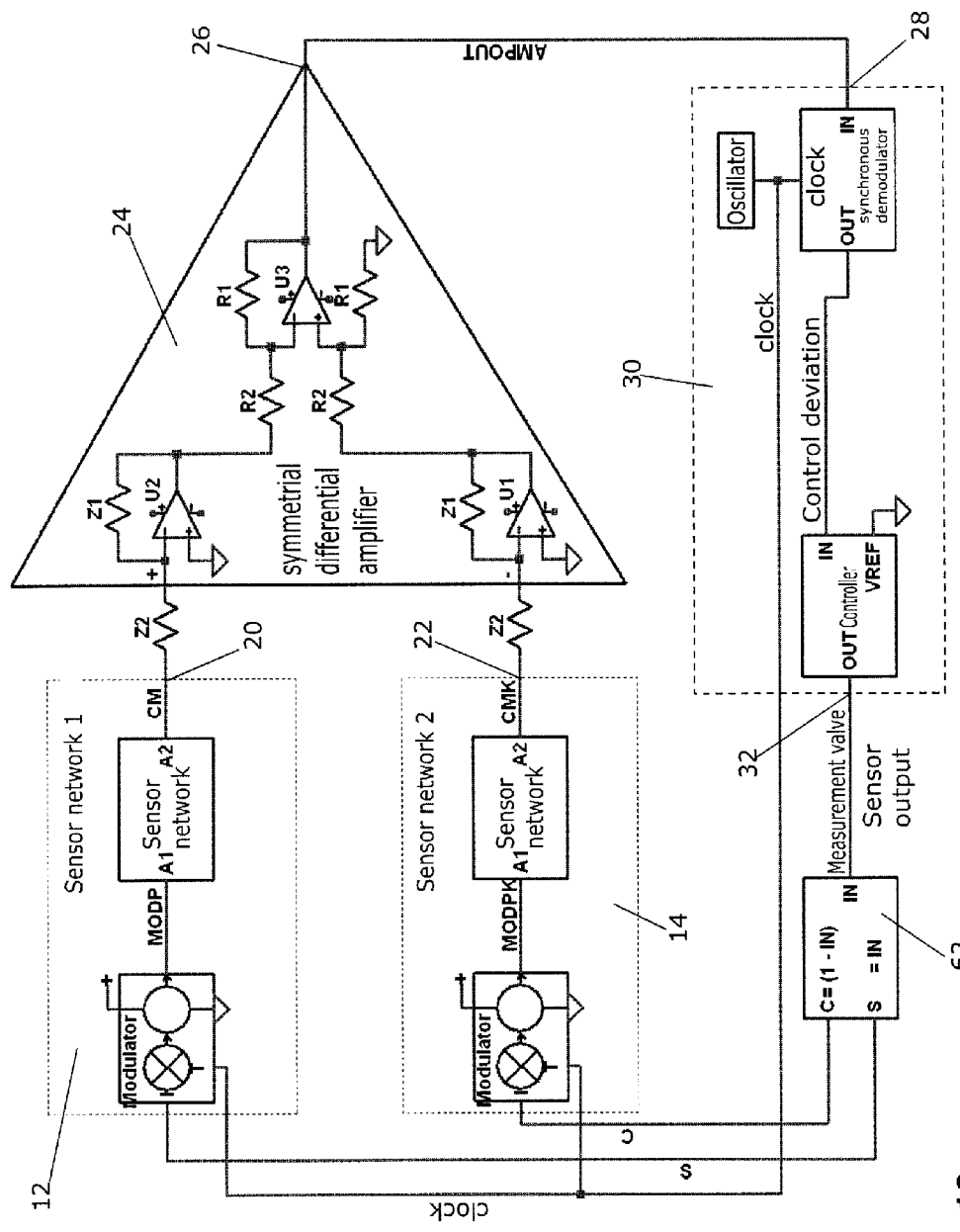

An alternative option for realizing the sensor measurement bridge is shown in FIG. 12. Here, in comparison to the block diagram of FIG. 8, the reference network and the inverted clock for controlling the reference network do not exist. Now, the summation of the useful signal is not performed anymore by a passive network at the nodes CM and respectively CMK but is performed actively at the output AM POUT of the differential amplifier.

As compared to the realization shown in FIG. 8 which can be switched between summation operation and difference operation, the presently described variant allows only for difference operation. Thus, the sensor output signal "measurement value" 32 reacts only to the differences between the two sensor networks 12 and 14. In case that the parameters to be measured will change to the same extent in the two sensor networks, the sensor will not respond to this. Thus, the sensor herein is a pure difference-value sensor.

According to the invention, electromagnetic interference entering the control circuit via the nodes CM and CMK will be damped by the common mode rejection of the differential amplifier.

Alternative Control Method

In the above described embodiments of the sensors, what was controlled was the amplitude of the modulation signal for the sensor and reference network. A further option resides in controlling the parameter value of one or a plurality of RLC network elements for achieving the zero signal compensation at the input of the demodulator.

Figure 13:
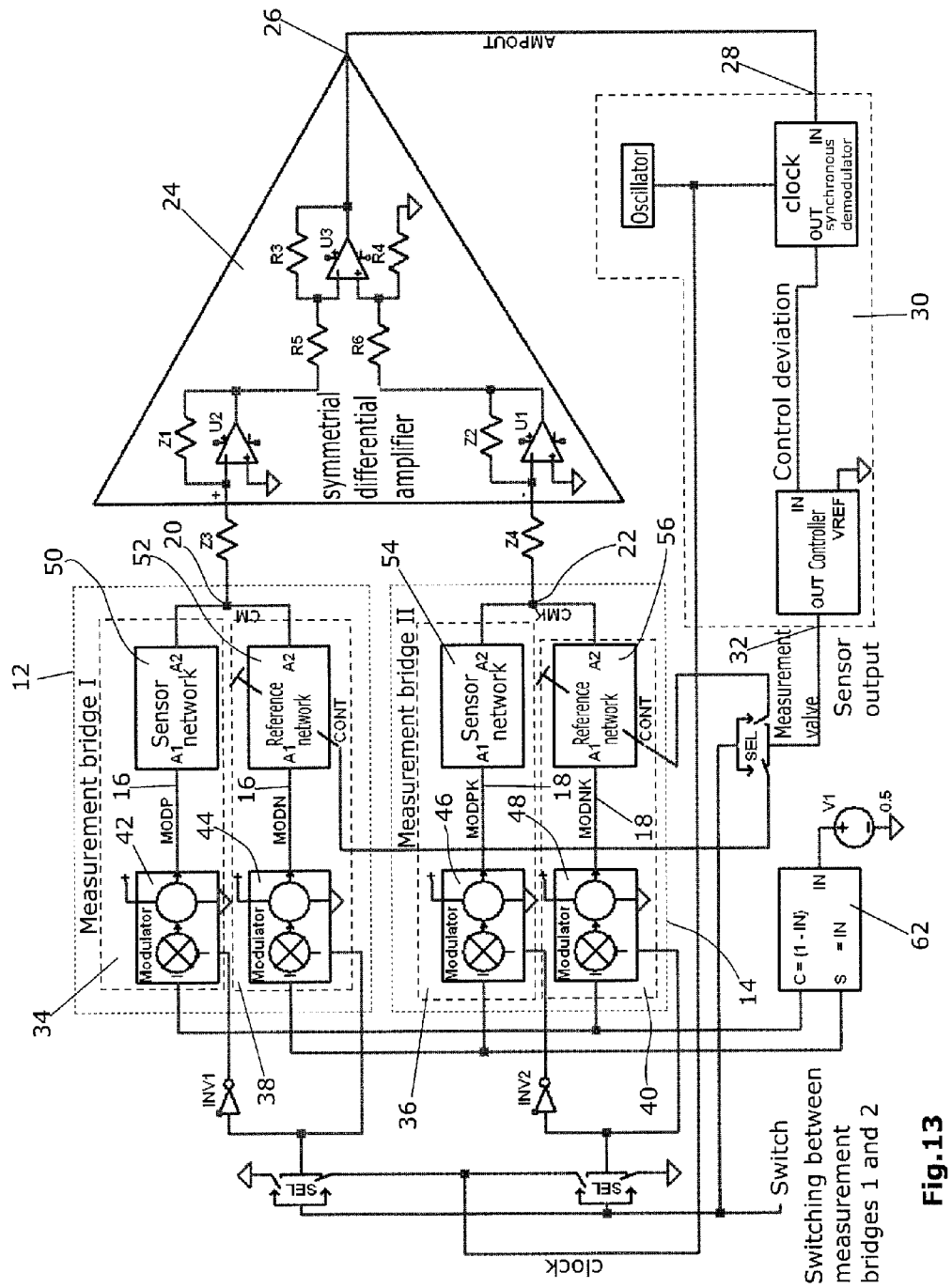

This functional principle is illustrated in the block diagram shown in FIG. 13. The measurement bridges 16,18 are activated sequentially. In the block diagram, it is the measurement bridge 1 that is active at the output "measurement value", which corresponds to the switch position of the changeover switch. As before, the two modulators are controlled by an inverted clock. The amplitude, however, is kept at a constant value in both modulators. The control in this case is performed by adjusting, in the reference network, the value of the relevant component part until a mutually adjusted state between the sensor network and the reference network has been established again or a zero signal exists at the node AM POUT 26.

It is also possible to combine said two control types with each other. For instance, one can first perform a pre-adjustment via the control of the value of a component part in the reference network, and then, in a second phase, proceed with the fine-tuning by the control of the modulation amplitude.

By the above process, it is possible, via said pre-adjustment, to move the sensor into a more sensitive region of the characteristic line and then, by control of the amplitude, to continue the measurement with higher resolution. A further benefit resides in that, by way of the parametric adjustment of the reference network, the precision of the measurement method at this working point can be increased.

Adjustment Options for Improving the EMW

Figure 14:
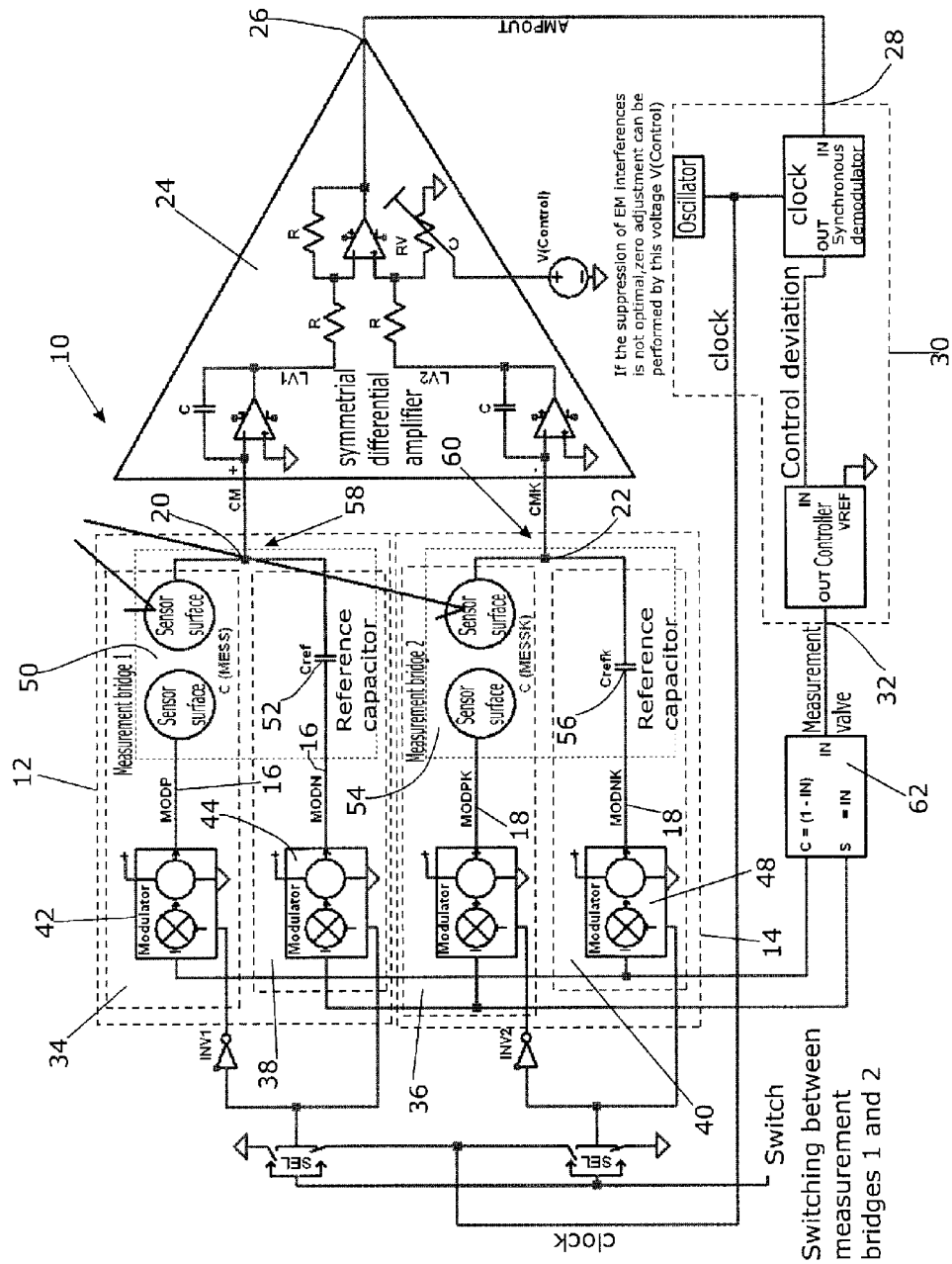

If the incoupling of the electromagnetic interferences does not occur ideally symmetrically at the nodes CM and CMK, it may happen, depending on the circumstances, that the suppression of the interference is insufficient for the present application. In this case, it is possible to adjust the interferences to zero by changing the amplification factor, relative to the positive and negative inputs of the differential amplifier, in an asymmetric manner. FIG. 14 illustrates an option of changing the amplification factor of the negative input relative to the positive input.

Adjustment can be effected also at other sites in the amplifier circuit. For instance, the feedback capacitors in the charge amplifiers can be made adjustable and, by mutual detuning, external asymmetries of the sensor can be compensated for.

List of Reference Numerals

10 Sensor
12 First measurement channel
14 Second measurement channel
16 Input of first measurement channel
18 Input of second measurement channel
20 Output of first measurement channel
22 Output of second measurement channel
24 Main subtractor
26 Output of main subtractor
28 Input of control unit
30 Control unit
32 Output of control unit
34 Measurement branch of first measurement channel
36 Measurement branch of second measurement channel
38 Reference branch of first measurement channel
40 Reference branch of second measurement channel
42 Control unit of measurement branch of first measurement channel
44 Control unit of reference branch of first measurement channel
46 Control unit of measurement branch of second measurement channel
48 Control unit of reference branch of second measurement channel
50 Measurement capacity of reference branch of first measurement channel
52 Reference capacity of reference branch of first measurement channel
54 Measurement capacity of measurement branch of second measurement channel
56 Reference capacity of reference branch of second measurement channel
58 Subtractor of first measurement channel
60 Subtractor of second measurement channel
62 Unit for generating amplitudes as a function of the measurement value

We claim:

1. An interference-compensated sensor for contactless detection of an object located in a detection area, said sensor being particularly a rain sensor, said sensor comprising
a first measuring channel and a second measuring channel each including a control device and an output, both said measuring channels particularly being substantially identical,
a main subtractor including an output for outputting the difference of the signals at the outputs of the measuring channels, and
a controller unit including an input connected to the output of the main subtractor and including an output for outputting a controller signal, by means of which the two measuring channels can be controlled in such a manner that the signal at the output of the main subtractor can be controlled to zero,
on the basis of the magnitude of the signal at the output of the controller, it being determinable whether an object is located in the detection area.

2. The sensor of claim 1, wherein the two measurement channels are controllable simultaneously or in a temporally alternating manner.

3. The sensor of claim 1, wherein geometrical and electrical asymmetries between the measurement channels can be compensated for by an adjustable weighting in the subtractor.

4. The sensor of claim 1, wherein each measurement channel comprises a capacitive, inductive, optical and/or resistive measurement sensor element and reference element, respectively.

5. The sensor of claim 4, wherein each of the first and second subtractors and/or of the further subtractors comprises a signal amplifier.

6. The sensor of claim 4, wherein the control units of the measurement and reference branches of the two measurement channels can be controlled with the aid of the controller signal.

7. The sensor of claim 4, wherein the reference channels comprise adjustable reference elements and the reference elements of the reference channels of the two measurement branches can be changed with the aid of the controller signal.

8. The sensor of claim 1, wherein:
each measurement channel comprises a measurement branch with a measurement branch control unit for generating a measurement signal at an output of the measurement branch, and a reference branch with a reference branch control unit for generating a reference signal at an output of the reference branch,
a first and a second measurement channel subtractor are provided, each measurement channel having assigned to it a respective subtractor for obtaining the difference signal between the measurement and reference signals at the outputs of the measurement and reference branches of the respective measurement channel, and the difference signal being provided at the measurement channel output of the respective measurement channel,
the main subtractor is arranged between the first and second measurement channel subtractors on the one hand and the control unit on the other hand, and
the measurement and reference branches of the two measurement channels are controllable on the basis of the controller output signal in such a manner that the difference signal of the measurement and reference signals of each measurement channel can be controlled to zero.

9. The sensor of claim 8, wherein each measurement channel is controllable intermittently and its measurement and reference branches are controllable in push-pull operation.

10. The sensor of claim 8, wherein the zero controlling of the first and second measurement channels and respectively of the measurement and reference branches of the first and second measurement channels is performed by amplitude modulation.

11. The sensor of claim 8, wherein each of the first and second subtractors is formed as a connecting node of the outputs of the measurement and reference branch of the respective measurement channel.

12. The sensor of claim 8, wherein each of the first and second subtractors and/or of the further subtractors comprises a signal amplifier.

13. The sensor of claim 8, wherein the control units of the measurement and reference branches of the two measurement channels can be controlled with the aid of the controller signal.

14. The sensor of claim 8, wherein the reference channels comprise adjustable reference elements and that the reference elements of the reference channels of the two measurement branches can be changed with the aid of the controller signal.

15. The sensor of claim 8, wherein each of the first and second subtractors is formed as a connecting node of the outputs of the measurement and reference branch of the respective measurement channel.

16. The sensor of claim 8, wherein each measurement and reference branch comprises a capacitive, inductive, optical and/or resistive measurement sensor element and reference element, respectively.

17. The sensor of claim 16, wherein each measurement channel is controllable intermittently and its measurement and reference branches are controllable in push-pull operation.

* * * * *